United States Patent
Radosavljevic et al.

(10) Patent No.: US 10,811,501 B2
(45) Date of Patent: Oct. 20, 2020

(54) INN TUNNEL JUNCTION CONTACTS FOR P-CHANNEL GAN

(71) Applicant: INTEL CORPORATION, Santa Clara, CA (US)

(72) Inventors: Marko Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/326,857

(22) PCT Filed: Sep. 29, 2016

(86) PCT No.: PCT/US2016/054368
§ 371 (c)(1),
(2) Date: Feb. 20, 2019

(87) PCT Pub. No.: WO2018/063224
PCT Pub. Date: Apr. 5, 2018

(65) Prior Publication Data
US 2019/0207003 A1    Jul. 4, 2019

(51) Int. Cl.
*H01L 29/20*    (2006.01)
*H01L 29/66*    (2006.01)
(Continued)

(52) U.S. Cl.
CPC ...... *H01L 29/2003* (2013.01); *H01L 29/0847* (2013.01); *H01L 29/0895* (2013.01);
(Continued)

(58) Field of Classification Search
CPC .............. H01L 29/0847; H01L 29/205; H01L 29/66522; H01L 29/66545; H01L 29/0895; H01L 29/2003
See application file for complete search history.

(56) References Cited

U.S. PATENT DOCUMENTS

| 8,680,580 B2 | 3/2014 | Ota |
| 2007/0194300 A1 | 8/2007 | Ibbetson et al. |

(Continued)

FOREIGN PATENT DOCUMENTS

| JP | 2009066434 | 3/2011 |
| WO | 2016099509 | 6/2016 |

OTHER PUBLICATIONS

International Searching Authority, "Search Report and Written Opinion," issued in connection with PCT patent application No. PCT/2016/054368, dated Jun. 29, 2017, 10 pages.
(Continued)

*Primary Examiner* — Seahvosh Nikmanesh
(74) *Attorney, Agent, or Firm* — Green, Howard & Mughal LLP

(57) ABSTRACT

Methods and apparatus for semiconductor manufacture are disclosed. An example apparatus includes a Gallium Nitride (GaN) substrate; a p-type GaN region positioned on the GaN substrate; a p-type Indium Nitride (InN) region positioned on the GaN substrate and sharing an interface with the p-type GaN region; and a n-type Indium Gallium Nitride (InGaN) region positioned on the GaN substrate and sharing an interface with the p-type InN region.

20 Claims, 7 Drawing Sheets

(51) Int. Cl.
  *H01L 29/08* (2006.01)
  *H01L 29/205* (2006.01)
(52) U.S. Cl.
  CPC ...... *H01L 29/205* (2013.01); *H01L 29/66522* (2013.01); *H01L 29/66545* (2013.01)

(56) References Cited

U.S. PATENT DOCUMENTS

2013/0093497 A1   4/2013  Lee et al.
2018/0323106 A1*  11/2018 Dasgupta .......... H01L 21/02458

OTHER PUBLICATIONS

Wen Jun Li et al., "Polarization-Engineered III-Nitride Heterojunction Tunnel Field-Effect Transistors," IEEE Journal on Exploratory Solid-State Computational Devices and Circuits, 2015, 7 pages.

* cited by examiner

INN TUNNEL JUNCTION CONTACTS FOR P-CHANNEL GAN

CROSS-REFERENCE TO RELATED APPLICATIONS

This patent is a nationalization of International Patent Application Serial No. PCT/US2016/054368 which was filed on Sep. 29, 2016 and entitled "InN Tunnel Junction Contacts for P-Channel GaN". International Application Serial No. PCT/US2016/054368 is hereby incorporated herein by reference in its entirety.

FIELD OF THE DISCLOSURE

This disclosure relates generally to semiconductors, and, more particularly, to methods and apparatus to form transistors using tunnel junctions.

BACKGROUND

Solid materials each have a characteristic energy-band structure. Variation in band structure between materials provides a variety of electrical characteristics. In semiconductors and insulators, electrons are confined to a number of bands of energy and excluded from other regions outside those bands. The term "band gap" refers to an energy difference between a top of a valence band and a bottom of a conduction band, where electrons can jump from one band to another. However, a minimum amount of energy is used for an electron to jump from the valence band to the conduction band, and that energy differs by material.

A semiconductor is a material with a small but non-zero band gap between valence and conduction bands. Semiconductor material behaves as an insulator at absolute zero, but allows thermal excitation of electrons into its conduction band at temperatures that are below the semiconductor melting point. In contrast, a material with a large band gap is an insulator. In conductors, the valence and conduction bands may overlap, so they may not have a band gap. Semiconductor conductivity relates to its band gap.

Gallium nitride (GaN) is a semiconductor material that has a relatively wide bandgap. For example, traditional semiconductor materials, such as silicon (Si) and gallium arsenide (GaAs), have a bandgap on the order of approximately 1 to 1.5 electronvolts (eV). In contrast, GaN has a bandgap of approximately 3.4 eV. The relatively high bandgap results in a relatively high breakdown voltage that makes GaN desirable for high power and/or high frequency applications. However, difficulty of doping GaN renders it unsuitable for such applications.

Figure 1:
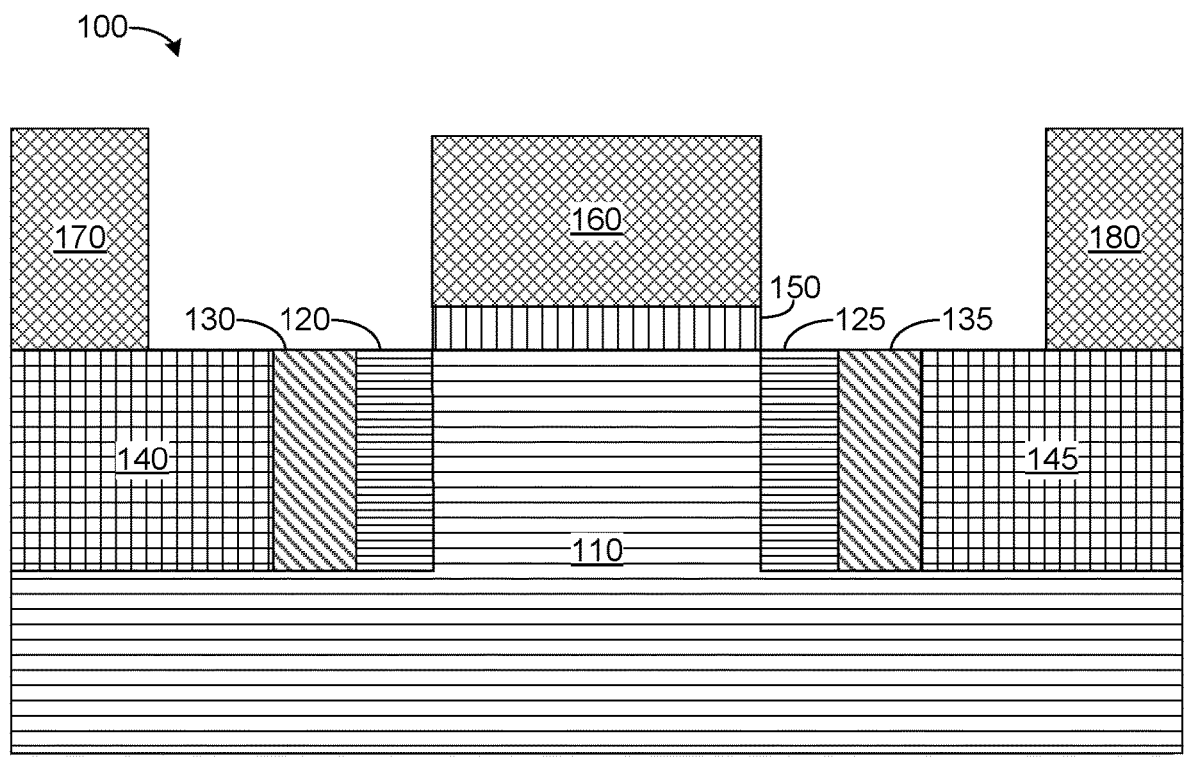
FIG. 1 illustrates an example horizontal transistor stack.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized and that logical, mechanical, electrical and/or other changes may be made without departing from the scope of the subject matter of this disclosure. The following detailed description is, therefore, provided to describe example implementations and not to be taken as limiting on the scope of the subject matter described in this disclosure. Certain features from different aspects of the following description may be combined to form yet new aspects of the subject matter discussed below.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Methods and apparatus for formation of semiconductor devices using Indium Nitride (InN) tunnel junction contacts for p-channel Gallium Nitride (GaN) semiconductor material are provided. InN is a small bandgap (e.g., 0.7 eV) semiconductor material that is capable of being formed at temperatures below 400° C. using plasma molecular beam epitaxy (MBE) and NH3-MBE beam epitaxy. InN grown at such temperatures is a semiconductor characterized by an electron Hall mobility that is comparable with semiconductor made of Silicon (Si). In semiconductor materials, a bandgap is an energy range where no electron states exist.

GaN is a binary III/V direct bandgap (e.g., 3.4 eV) semiconductor formed from a hard material having a Wurtzite crystal structure. A conduction band offset between GaN and InN is in the range of 1.4-2.3 eV, and a valence band offset is between 0.5-1.07 eV, for example. GaN may be mixed with InN to form indium gallium nitride (InGaN), which has a relatively high bandgap to take advantage of the benefits of GaN described above and that can be grown at a temperature below about 400° C., for example.

GaN is an important material for circuits, such as power management integrated circuits (PMICs) and power delivery applications, due to the large bandgap and high mobility (e.g., a high rate of speed for an electron moving through a metal or semiconductor when pulled by an electric field) associated with GaN. These qualities are useful in power train transistors (e.g., automotive integrated circuits (ICs) for power train applications), for example. PMICs, however, include logic and controller circuits that work best when high performance, low leakage p-channel devices are employed.

PMICs provide highly integrated, high-performance power management solutions for a wide range of applications in the automotive, consumer, and industrial markets. With integration of power management, system control, battery management, interface and audio functions, as well as other system specific functions, the PMICs are designed to offer improved integration for a wide range of devices. By leveraging high-performance process technologies, PMICs offer high-efficiency solutions designed to extended battery life and reduce power dissipation.

Traditionally, GaN p-channel devices have been poor components based at least in part on a high access resistance due to an inability to dope GaN to a high p-type carrier concentration. The implementation of circuits such as voltage regulators and radio frequency (RF) power amplifiers involve both n-channel and p-channel control logic. Thus, while a GaN substrate may be beneficial to form n-type metal-oxide-semiconductor (NMOS) transistors, a different semiconductor substrate is needed to form the p-type metal-oxide-semiconductor (PMOS) transistors to avoid the poor characteristics of GaN for such p-channel devices. Certain examples improve the usefulness of GaN p-channel devices in PMIC and other applications by introducing a tunnel junction in a corresponding transistor stack.

Certain examples provide improved GaN p-channel devices using a tunnel junction in source and/or drain contacts. Using the tunnel junction, a low sheet resistance in p-type GaN can be transformed into a high access resistance in p-channel GaN transistors. Certain examples facilitate co-integration of a high-performance p-channel on GaN substrates, which is a key enabler of logic and control circuits in PMIC and radio frequency (RF) power amplifiers (PAs).

Certain examples enable doping of Indium Gallium Nitride (InGaN) to a very high n-type carrier concentration (e.g., >1e20/cm$^3$). InGaN is a semiconductor material made of a mix of gallium nitride and indium nitride. InGaN is a ternary group III/V direct bandgap semiconductor whose bandgap can be tuned by varying an amount of indium in the alloy.

Additionally, certain examples band engineer an abrupt n+ InGaN/thin p+ InN junction. The two layers of n+ InGaN and p+ InN can be grown on top of p-GaN. The layered stack results in high internal electric fields which bend the bands to provide an opportunity for electron tunneling from a conduction band of the n+ InGaN layer to a valence band of the p-GaN layer. The tunneling probability is inversely proportional to the thickness of the relevant films, especially p+ InN. Tunneling in a horizontal layered architecture becomes an efficient way to deliver charges into the transistor channel (p-GaN) while keeping access resistance low via n-channel GaN contact technology. That is, while it is very difficult to dope the p-type GaN, the p-type InN can be highly doped instead to generate high electric bands due to the bandgap which then cause bending of the conduction and valence bands and allow tunneling of charge through the material. Using a horizontal geometry, such a combination of InGaN, InN, and GaN can be used for metal-oxide-semiconductor high-electron-mobility-transistor (MOS-HEMT) type transistors and/or other transistors.

Epitaxy refers to deposition of a crystalline overlayer on a crystalline substrate. The overlayer is called an epitaxial film or epitaxial layer. Epitaxy is used to facilitate crystalline growth on semiconductor materials. Selective epitaxy refers to selectively growing one or more layers of semiconductor material over a substrate (e.g., heavy doping, narrow layer, etc.). In certain examples, selective epitaxy is performed in a horizontal direction to form an InGaN, InN, and GaN stack to improve performance of p-channel GaN transistors and allow for GaN complementary metal-oxide-semiconductors (CMOS) to achieve RF power amplifiers and voltage regulator circuits. While GaN and InN have very different lattice constants, which introduce defects if a thick layer of InN is grown on GaN, keeping an InN layer commensurate with a GaN layer can enable horizontal growth and layout, for example.

Thus, a high access resistance for GaN p-channel devices is improved by forming a tunnel junction in the transistor stack. More specifically, a tunnel junction is formed in the source/drain contacts of a GaN p-channel device, for example. A tunnel junction is a barrier, such as a thin insulating layer or electric potential, between two electrically conducting materials. Electrons (or quasiparticles) pass through the barrier via quantum tunneling. Classically, the electron has zero probability of passing through the barrier. Quantum tunneling refers to a quantum mechanical phenomenon in which a particle (e.g., the electron) tunnels through a barrier that it classically could not surmount.

FIG. 1 illustrates an example horizontal transistor stack 100 including a combination of InGaN, InN, and GaN. The example horizontal transistor stack 100 includes a GaN substrate 110 on which lightly-doped p-GaN material 120, 125 is grown. Additionally, highly-doped p+ InN material 130, 135 is grown next to the p- GaN material 120, 125, and highly-doped n+ InGaN material 140, 145 is grown on the GaN substrate 110 next to the p+ InN material 130, 135. A high-K dielectric material 150 (e.g., Silicon Nitride (SiN), Silicon Carbide (SiC), Hafnium Oxide (HfO$_2$), Zirconium Dioxide (ZrO$_2$), Aluminum Oxide (Al$_2$O$_3$), and/or other material with a permittivity greater than 3.9, etc.) is deposited on the GaN substrate 110, and a metal gate 160 (e.g., Titanium (Ti), Tungsten (W), Titanium Nitride (TiN), Cobalt (Co), Aluminum (Al), etc.) is deposited on the high-K dielectric 150. A metal source 170 (e.g., Ti, W, TiN, Co, Al, etc.) is deposited on the n+ InGaN material 140, and a metal drain 180 (e.g., Ti, W, TiN, Co, Al, etc.) is deposited on the n+ InGaN material 145.

Figure 2:
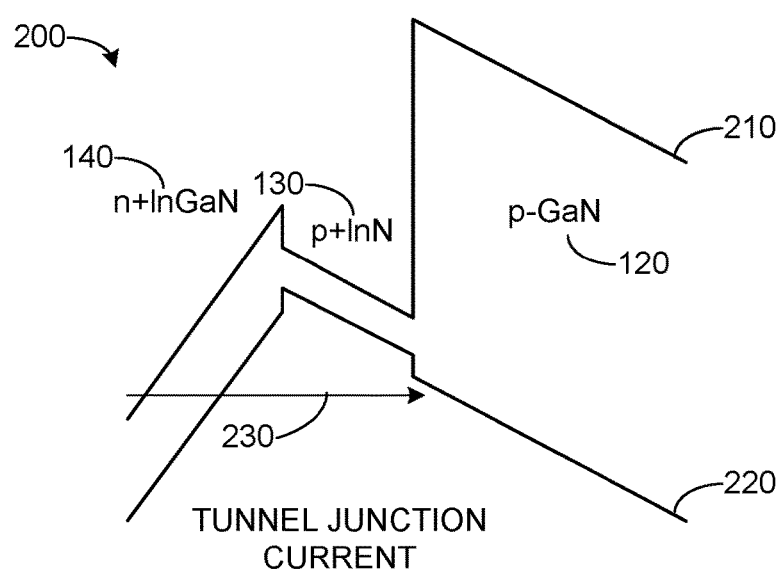
FIG. 2 illustrates an example energy band diagram for certain the semiconductor materials of FIG. 1

FIG. 2 illustrates an example energy band diagram 200 for the semiconductor materials p- GaN 120, p+ InN 130, and n+ InGaN 140 of the example device 100. The illustration of FIG. 2 holds true for materials 125, 135, 145 (mirror image) as well. The example of FIG. 2 illustrates a band gap between a conduction band 210 and a valence band 220 through the p- GaN material 120, p+ InN material 130, and n+ InGaN material 140. The horizontal arrangement of materials forms a tunnel junction between n+ InGaN 140 and p- GaN 120 using p+ InN 130.

An abrupt junction between the n+ InGaN layer 140 and thin p+ InN layer 130 produces a tunnel junction current 230 with highly doped n+ InGaN 140. As discussed above, a horizontal stack of the layers GaN 120, InN 130, InGaN 140, as shown in the example of FIG. 1, generates high electric fields in the material 120, 130, 140 which bend the bands to provide electron tunneling from a conduction band 160 of the n+ InGaN material 140 to a valence band 170 of the p- GaN material 120. Energy band bending refers to a change in energy offset of a semiconductor's band structure near a junction due to space charge effects. Band bending refers to the effect on energy states, not a physical or spatial bending of material. At the junction or interface between different semiconductors there is a sharp shift in band energies from one material to the other, but band alignment at the junction (e.g., a difference in conduction band energies) is fixed. The combination of p– GaN 120, p+ InN 130, and n+ InGaN causes delivery of charge to the p-GaN 120 transistor channel while keeping access resistance relatively low through n-channel GaN contact technology.

Figure 3A:
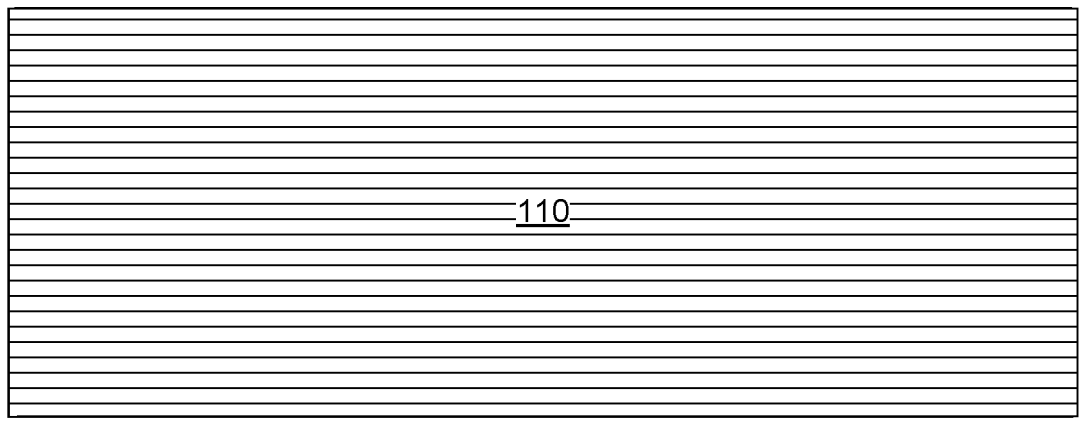
FIGS. 3A-3G illustrate a selective epitaxy process to generate the horizontal transistor stack of the example of FIG. 1.
Figure 3B:
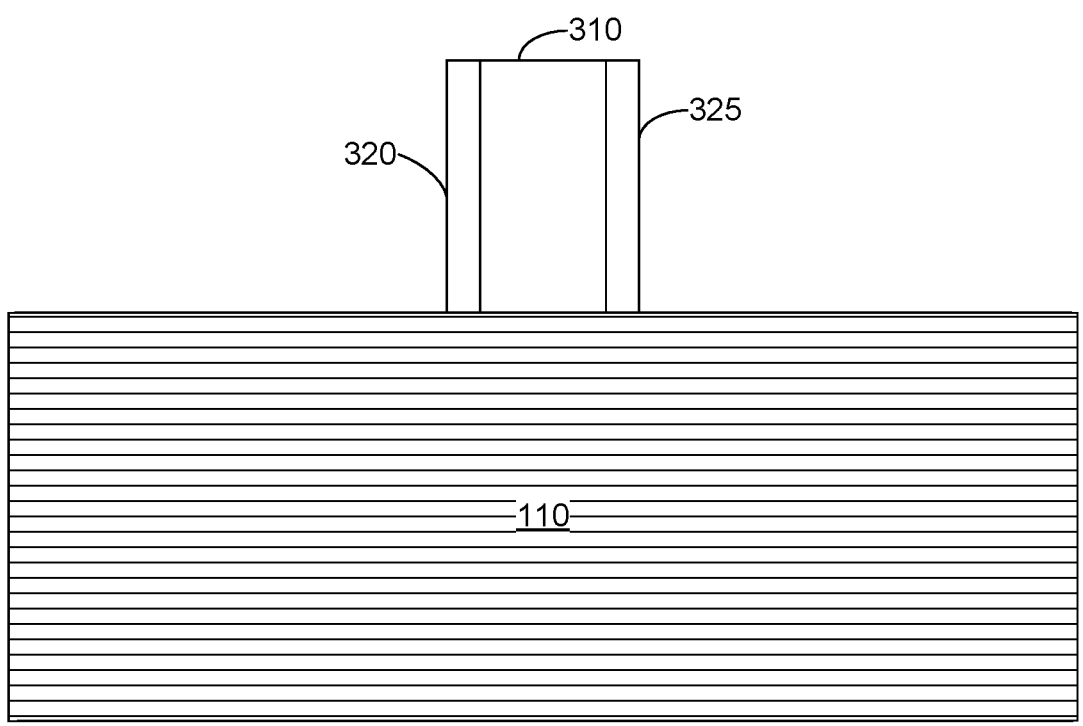

FIGS. 3A-3G illustrate a selective epitaxy process to generate the horizontal transistor stack 100 of the example of FIG. 1. As shown in the example of FIG. 3A, the process starts with the GaN substrate 110. Next, as shown in FIG. 3B, a dummy polysilicon (poly) 310 is deposited and patterned on the GaN substrate 110. A spacer 320, 325 is also deposited and etched with respect to the dummy poly 310 on the GaN substrate 110.

Figure 3C:
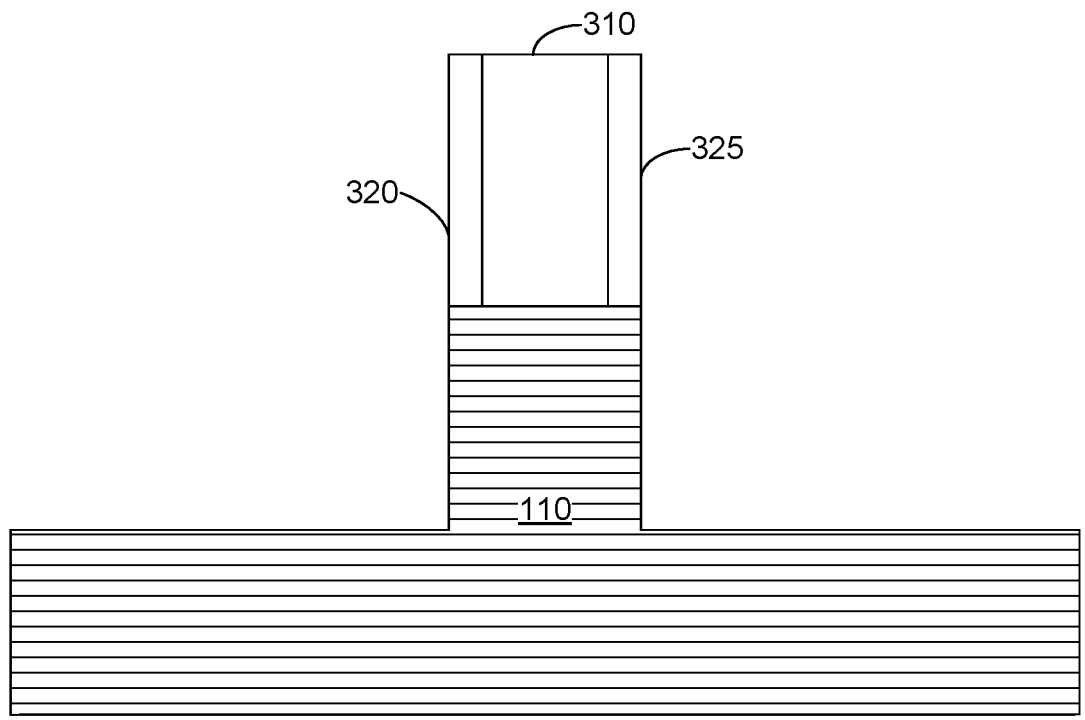
Figure 3D:
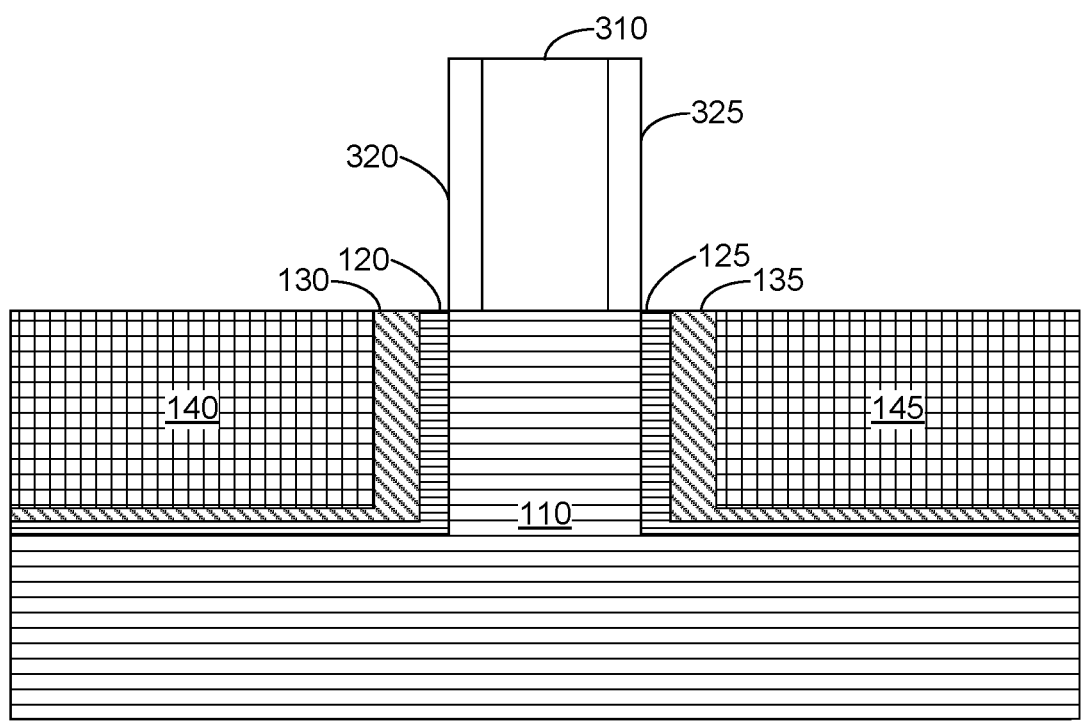

As shown in the example of FIG. 3C, the GaN substrate 110 is etched. In the example of FIG. 3D, the p– GaN material 120, 125, p+ InN material 130, 135, and n+ InGaN material 140, 145 are grown through source/drain (SD) epitaxy on the GaN substrate 110. Using SD epitaxy, deposition can be tuned so that lateral growth is faster than vertical growth (e.g., no epitaxy on amorphous surfaces). In some examples, because material is growing from all accessible crystalline surfaces, growth may be L-shaped, but a primary direction of growth can be maintained using selective epitaxy (e.g., lateral grown in a horizontal layout). In some examples, some faceting of the epitaxy may occur such that the top surface of the growth is not as flush as in the example depiction of FIG. 3D.

Figure 3E:
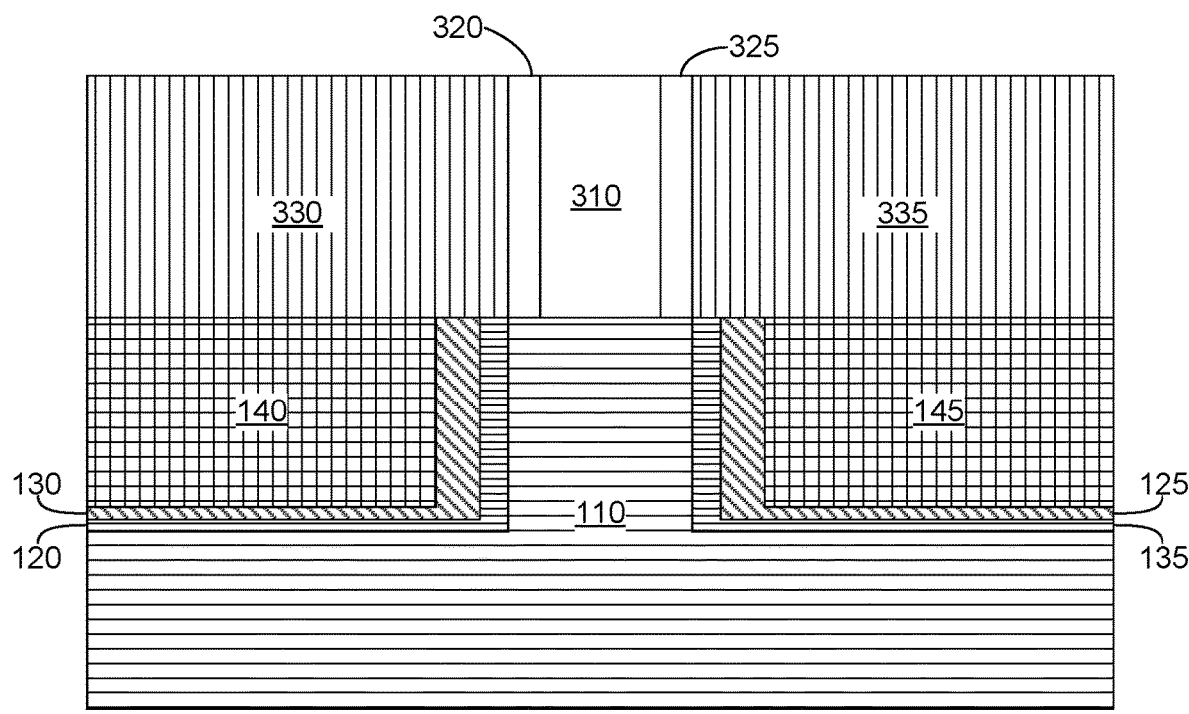
Figure 3F:
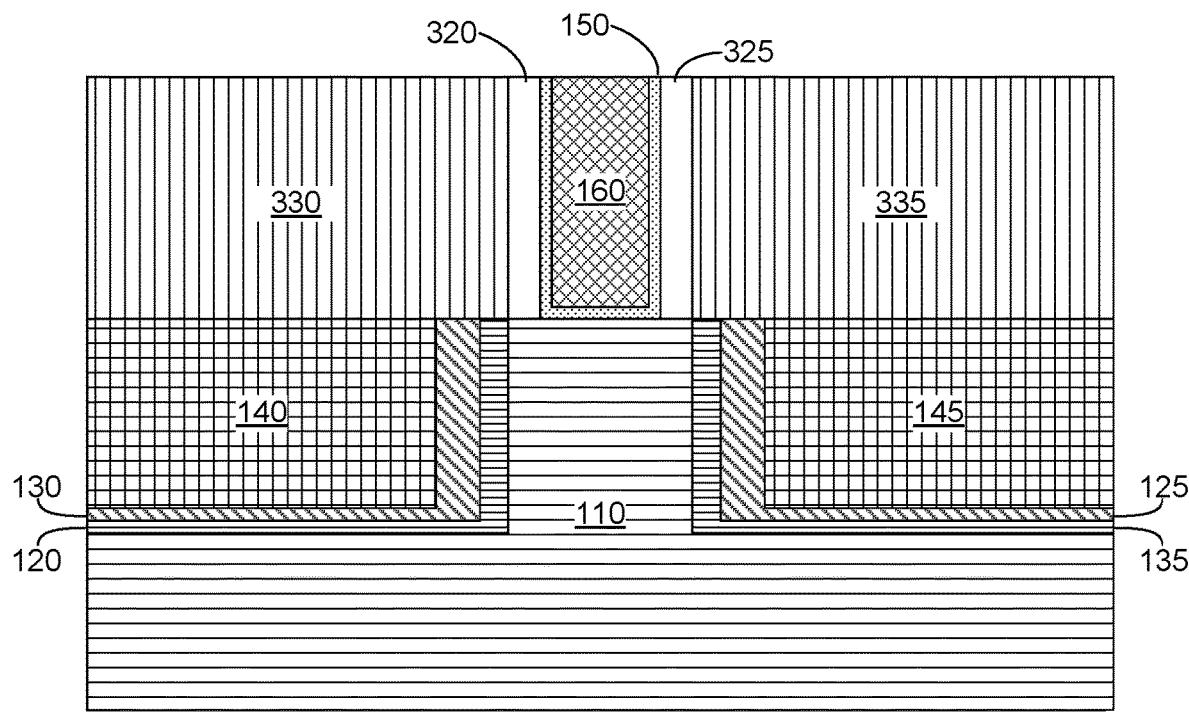
Figure 3G:
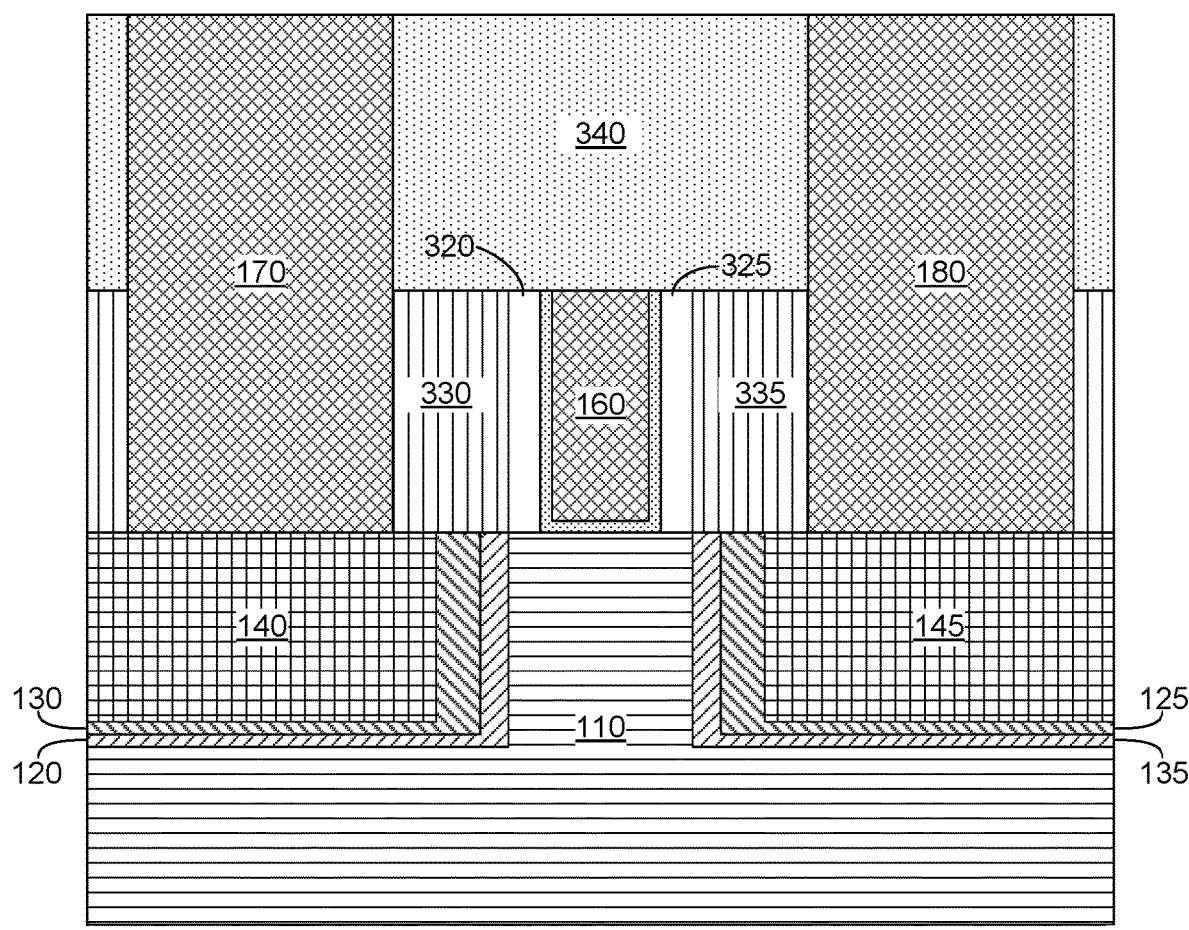

As shown in the example of FIG. 3E, isolation deposition and polish occur to deposit an isolation material 330, 335 (e.g., an oxide such as a thermal grown oxide, silicate, etc.) on top of the stack, stopping at the dummy poly 310. FIG. 3F shows an example replacement of the dummy poly 310 with the metal gate 160 by removing the poly 310, depositing the high-K dielectric 150 and metal gate 160, and polishing. As shown in the example of FIG. 3G, isolation deposition and contact patterning and etching enable space for the deposition of metal source 170 and drain 180 and polishing to form the completed transistor stack 100.

Thus, for applications such as radio frequency (RF) communications, power delivery, etc., in which an n-channel material is desired, GaN can be used to provide improvements in technologies such as automotive, high-voltage, satellite, etc. In the mobile applications space, n+ and p+ devices can be used to reduce power consumed by a circuit. When an n-channel and a p-channel are included in the same device, one channel is off at a given time. While if only a p-channel or an n-channel is present, circuit manipulations are performed to provide functionality, which results in increased power consumption too great for mobile applications.

Certain examples provide n-channel as well as p-channel device in GaN, despite access resistance to the GaN device. In certain examples, the architecture is laid out horizontally, rather than vertically, to enable integration of large scale circuits (e.g., one million transistors, one billion transistors, etc., on a chip). Using a horizontal layout, band alignment is more difficult than vertical alignment, and a dummy gate (e.g., dummy poly 310) is used to etch the GaN surface 110. Holes are dug to the left and right of the dummy gate, and additional layers (e.g., p– GaN material 120, 125, p+ InN material 130, 135, and n+ InGaN material 140, 145) are grown epitaxialy inside those holes. Controlled, lateral epitaxial growth horizontally forms the transistor circuit 100.

In certain examples, n+ InGaN 140, 145 is used as implantable material for source 170 and drain 180. In certain examples, the InGaN material 140, 145 is doped to as high an n-type electron density (e.g., $5e19/cm^3$-$1e21/cm^3$, etc.) as possible. The InGaN 140, 145 serves as a contact layer, so its thickness can be more relaxed than other layers (e.g., 10-100 nanometers (nm), etc.). An aspect ratio of lateral to vertical thickness can vary since the material is used to fill in an opening and can grow more vertically or laterally (e.g., an aspect ratio of 0.25-5 lateral versus vertical growth, etc.).

Using p+ InN 130, 135 followed by p– GaN 120, 125 generates a tunnel junction current 110 (see, e.g., FIGS. 1 and 2) from the conduction band 160 of the n+ InGaN material 140, 145 to the valence band 170 of the p-GaN material 120, 125 to deliver charge to the p-GaN material 120, 125 while keeping access resistance relatively low through the GaN substrate 110.

The InN material 130, 135 is doped significantly p-type (e.g., doped to a hole density per cubic centimeter of $5e19/cm^3$-$1e21/cm^3$, etc.) to bend electron bands in the material to tunnel charges from the conduction band 160 to the valence band 170 of p– GaN 120, 125. Since the InN 130, 135 is a tunnel layer, thickness in the lateral direction is small (e.g., 1-5 nm, etc.), and has an aspect ratio weighted in the lateral direction rather than the vertical direction (e.g., has an aspect ratio of 1-5 indicating a thickness in the lateral direction is between 1× and 5× thicker than thickness of the material in the vertical direction, etc.). Distance between n+ InGaN 140, 145 and p– GaN 120, 125 through p+ InN 130, 135 is kept small for the tunneling to be efficient for charge to travel from the n+ layer 140, 245 to the p– layer 120, 125.

Using a thin p– GaN layer 120, 125, and high p and n doping density helps keep the bands 160, 170 sharp in the material. For example, as a tunnel layer, the GaN layer 120, 125 can be between 1-5 nm thick with an aspect ratio of 1-5 (e.g., lateral thickness between 1× and 5× thicker than the vertical thickness), etc. The GaN layer 120, 125 can be doped to a hole density of $1e16/cm^3$-$1e16/cm^3$, for example.

By integrating a p-channel GaN circuit with n-channel GaN, MOS-based circuitry can be created for logic analog circuits including p-channel devices to lower power consumption in n-channel circuits for communication, etc. (e.g., processors, communication circuits, automotive, etc.).

Figure 4:
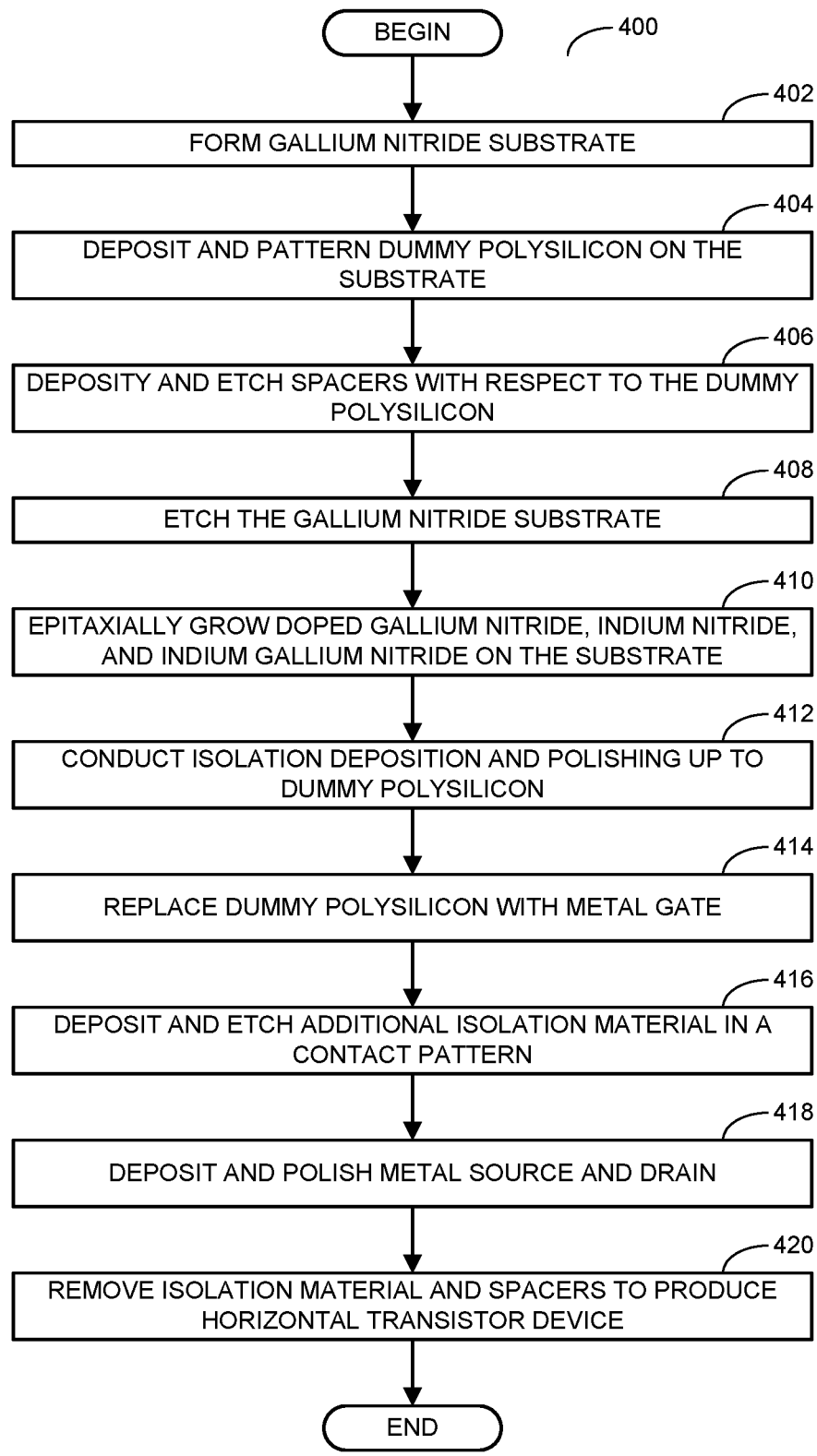
FIG. 4 is a flowchart representative of an example method to produce the multilayered horizontal transistor stack structure of FIG. 1.

FIG. 4 is a flowchart representative of an example method 400 to produce the multilayered horizontal transistor stack structure 100 of FIG. 1. The example method 400 of FIG. 4 begins to generate the horizontal transistor device 100 of the example of FIG. 1 via selective epitaxy. At block 402, the GaN substrate 110 is deposited (see, e.g., FIG. 3A). Next, at block 404, the dummy poly 310 is deposited and patterned on the GaN substrate 110 (see, e.g., FIG. 3B). At block 406, the spacer 320, 325 is deposited and etched with respect to the dummy poly 310 on the GaN substrate 110 (see, e.g., FIG. 3B).

At block 408, the GaN substrate 110 is etched (see, e.g., FIG. 3C). For example, photoenhanced chemical (PEC) etching can be used to wet etch the GaN substrate 110. The GaN substrate 110 can also be dry etched using reactive ion etching (RIE), inductively coupled plasma (ICP) etching, hydrogen etching, etc.

At block 410, the p– GaN material 120, 125, p+ InN material 130, 135, and n+ InGaN material 140, 145 are grown through source/drain (SD) epitaxy on the GaN substrate 110 (see, e.g., FIG. 3D). Using SD epitaxy, deposition can be tuned so that lateral growth is faster than vertical growth (e.g., no epitaxy on amorphous surfaces). In some examples, because material is growing from all accessible crystalline surfaces, growth may be L-shaped, but a primary direction of growth can be maintained using selective epitaxy (e.g., lateral grown in a horizontal layout). In some examples, some faceting of the epitaxy may occur such that the top surface of the growth is not as flush as in the example depiction of FIG. 3D.

At block 412, isolation deposition and polishing occur, stopping on the dummy poly 310 (see, e.g., FIG. 3E). For example, the isolation material 330, 335, such as an oxide, silicate, etc., is deposited and excess isolation material 330, 335 is removed by polishing to cover the exposed surface except for the dummy poly 310 and spacers 320, 325.

At block 414, the dummy poly 310 is replaced with the metal gate 160 by removing the poly 310, depositing the high-K dielectric 150 and metal gate 160, and polishing to remove excess material (see, e.g., FIG. 3F).

At block 416, additional isolation material 340 is deposited, and etching is performed in a contact pattern in isolation material 330, 335, 340 (see, e.g., FIG. 3G) to enable space for the deposition of metal source 170 and drain 180. At block 418, the metal source 170 and drain 180 are deposited (e.g., Ti, TiN, W, Co, Al, etc.) and polished (see, e.g., FIG. 3G), such as using chemical mechanical polishing (CMP), etc., to remove excess material and form the source 170 and drain 180 on top of the stack.

At block 420, the isolation material 330, 335, 340 and spacers 320, 325 are removed to produce the horizontal transistor device 100 (see, e.g., FIG. 1). After the isolation and spacer material 320-340 is removed, the process ends, and the device 100 is ready for use in a circuit.

As described above, a flowchart representative of example method to implement the examples disclosed herein is shown in FIG. 4. The example method may be implemented by machine readable instructions that comprise a program(s) for execution by a processor such as the processor 512 shown in the example processor platform 500 discussed below in connection with FIG. 5. The program may be embodied in software stored on a tangible computer readable storage medium such as a CD-ROM, a floppy disk, a hard drive, a digital versatile disk (DVD), a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowchart illustrated in FIG. 4, many other methods of implementing the examples disclosed herein may alternatively be used. For example, the order of execution of the blocks may be changed, and/or some of the blocks described may be changed, eliminated, or combined.

As mentioned above, the example method of FIG. 4 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example method of FIG. 4 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 5:
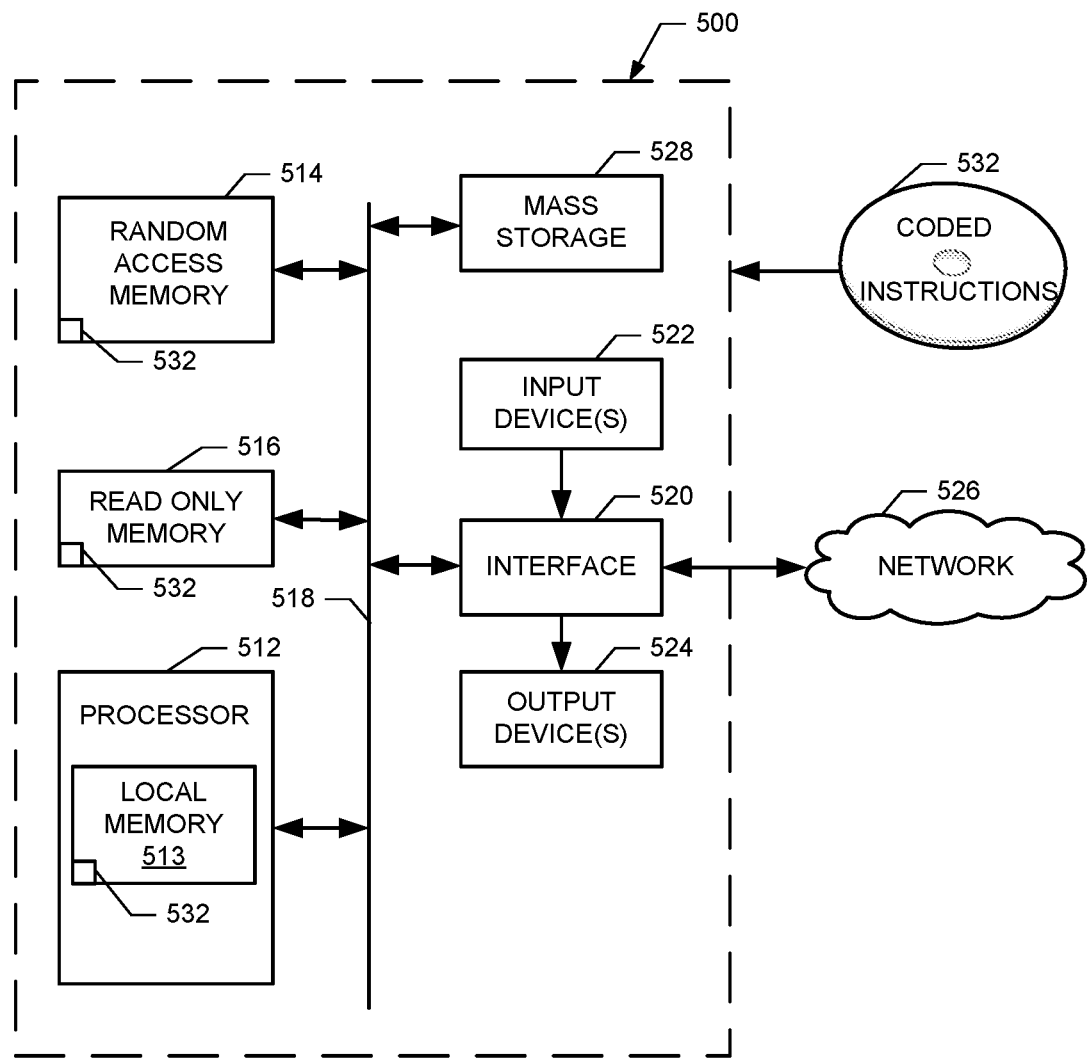
FIG. 5 is a block diagram of an example processor platform capable of executing the instructions of FIG. 4 to implement the examples disclosed herein.

FIG. 5 is a block diagram of an example processor platform 500 capable of executing the instructions of FIG. 4 to implement the examples disclosed herein. The processor platform 500 can be, for example, a semiconductor fabrication device, a wafer/die production controller, a wafer producing/processing device, a die/wafer etching device, a server, a personal computer, a mobile device (e.g., a cell phone, a smart phone, a tablet such as an iPad™), a personal digital assistant (PDA), an Internet appliance, a set top box, or any other type of computing device.

The processor platform 500 of the illustrated example includes a processor 512. The processor 512 of the illustrated example is hardware. For example, the processor 512 can be implemented by one or more integrated circuits, logic circuits, microprocessors or controllers from any desired family or manufacturer.

The processor 512 of the illustrated example includes a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 516 may be implemented by flash memory and/or any other desired type of memory device. Access to the main memory 514, 516 is controlled by a memory controller.

The processor platform 500 of the illustrated example also includes an interface circuit 520. The interface circuit 520 may be implemented by any type of interface standard, such as an Ethernet interface, a universal serial bus (USB), and/or a PCI express interface.

In the illustrated example, one or more input devices 522 are connected to the interface circuit 520. The input device(s) 522 permit(s) a user to enter data and commands into the processor 512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 524 are also connected to the interface circuit 520 of the illustrated example. The output devices 524 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 520 of the illustrated example, thus, typically includes a graphics driver card, a graphics driver chip or a graphics driver processor.

The interface circuit 520 of the illustrated example also includes a communication device such as a transmitter, a receiver, a transceiver, a modem and/or network interface card to facilitate exchange of data with external machines (e.g., computing devices of any kind) via a network 526 (e.g., an Ethernet connection, a digital subscriber line (DSL), a telephone line, coaxial cable, a cellular telephone system, etc.).

The processor platform 500 of the illustrated example also includes one or more mass storage devices 528 for storing software and/or data. Examples of such mass storage devices 528 include floppy disk drives, hard drive disks, compact disk drives, Blu-ray disk drives, RAID systems, and digital versatile disk (DVD) drives.

Coded instructions 532, such as coded instructions 532 to execute the method of FIG. 4, may be stored in the mass storage device 528, in the volatile memory 514, in the non-volatile memory 516, and/or on a removable tangible computer readable storage medium such as a CD or DVD.

From the foregoing, it will be appreciated that the above disclosed methods, apparatus and articles of manufacture allow GaN to be used to implement p-channel devices as well as n-channel devices. The disclosed examples improve GaN p-channel performance through introduction of a tunnel junction in source and drain contacts of the transistor stack. The disclosed examples co-integrate high-performance p-channel on GaN substrates to enable logic and control circuits.

Example 1 includes an apparatus including a Gallium Nitride (GaN) substrate; a p-type GaN region positioned on the GaN substrate; a p-type Indium Nitride (InN) region positioned on the GaN substrate and sharing an interface with the p-type GaN region; and a n-type Indium Gallium Nitride (InGaN) region positioned on the GaN substrate and sharing an interface with the p-type InN region.

Example 2 includes the subject matter of example 1, wherein the p-type GaN region, the p-type InN region, and the n-type InGaN region are arranged in horizontally in a layer positioned on the GaN substrate.

Example 3 includes the subject matter of example 1, wherein the p-type GaN region is doped to a concentration of holes between 1e16/centimeters$^3$ and 1e17/centimeters$^3$.

Example 4 includes the subject matter of example 1, wherein the p-type InN region is doped to a concentration of holes between 5e19/centimeters$^3$ and 1e21/centimeters$^3$.

Example 5 includes the subject matter of example 1, wherein the n-type InGaN region is doped to a concentration of holes between 5e19/centimeters$^3$ and 1e21/centimeters$^3$.

Example 6 includes the subject matter of examples 4 and/or 5, wherein the p-type GaN region is doped to a concentration of holes between 1e16/centimeters$^3$ and 1e17/centimeters$^3$.

Example 7 includes the subject matter of examples 3 and/or 5, wherein the p-type InN region is doped to a concentration of holes between 5e19/centimeters$^3$ and 1e21/centimeters$^3$.

Example 8 includes the subject matter of example 3 and/or 4, wherein the n-type InGaN region is doped to a concentration of holes between 5e19/centimeters$^3$ and 1e21/centimeters$^3$.

Example 9 includes a Gallium Nitride (GaN) substrate, the GaN substrate having a non-etched surface, first and second vertical etched surfaces, the first vertical etched surface on a first side of the non-etched surface and the second vertical etched surface on a second side of the non-etched surface, and first and second horizontal etched surfaces, the first horizontal etched surface on the first side of the non-etched surface and the second horizontal etched surface on a second side of the non-etched surface. The device of example 9 includes a high k dielectric material on the non-etched surface of the GaN substrate and a gate on the high k dielectric material. The device of example 1 includes first and second p-type GaN regions, the first p-type GaN region on a first side of the gate, the second p-type GaN region on a second side of the gate, the first p-type GaN region sharing an interface with the first vertical etched surface of the GaN substrate and the horizontal etched surface of the GaN substrate, and the second p-type GaN regions sharing an interface with the second vertical etched surface of the GaN substrate and the second horizontal etched surface of the GaN substrate. The device of example 9 includes first and second p-type Indium Nitride (InN) regions, the first p-type InN region on the first side of the gate, the second p-type InN region on the second side of the gate, the first p-type InN region sharing an interface with the first p-type GaN region, and the second p-type InN region sharing an interface with the second p-type GaN region. The device of example 9 includes first and second n-type Indium Gallium Nitride (InGaN) regions, the first n-type InGaN region on the first side of the gate, the second n-type InGaN region on the second side of the gate, the first n-type InGaN region sharing an interface with the first p-type InN region, and the second n-type InGaN region sharing an interface with the second p-type InN region. The device of example 1 includes a source on the first n-type InGaN region, and a drain on the second n-type InGaN region.

Example 10 includes the subject matter of example 9, wherein the GaN substrate is doped p-type.

Example 11 includes the subject matter of example 9, wherein the first and second p-type GaN regions are doped to a concentration of holes between 1e16/centimeters$^3$ and 1e17/centimeters$^3$.

Example 12 includes the subject matter of example 11, wherein the first and second p-type GaN regions have a thickness in a lateral direction between 1-5 nanometers.

Example 13 includes the subject matter of example 9, wherein the first and second p-type InN regions are doped to a concentration of holes between 5e19/centimeters$^3$ and 1e21/centimeters$^3$.

Example 14 includes the subject matter of example 13, wherein the first and second p-type InN regions have a thickness in a lateral direction between 1-5 nanometers.

Example 15 includes the subject matter of example 9, wherein the first and second n-type InGaN regions are doped to a concentration of holes between 5e19/centimeters$^3$ and 1e21/centimeters$^3$.

Example 16 includes the subject matter of example 15, wherein the first and second n-type InGaN regions have a thickness in a lateral direction between 10-100 nanometers.

Example 17 includes the subject matter of examples 11, 12, 15, and/or 16, wherein the first and second p-type InN regions are doped to a concentration of holes between 5e19/centimeters$^3$ and 1e21/centimeters$^3$.

Example 18 includes the subject matter of example 17, wherein the first and second p-type InN regions have a thickness in a lateral direction between 1-5 nanometers.

Example 19 includes the subject matter of examples 11, 12, 13, and/or 14, wherein the first and second n-type InGaN regions are doped to a concentration of holes between 5e19/centimeters$^3$ and 1e21/centimeters$^3$.

Example 20 includes the subject matter of example 19, wherein the first and second n-type InGaN regions have a thickness in a lateral direction between 10-100 nanometers.

Example 21 includes the subject matter of any of examples 1-20, wherein the high k dielectric material has a permittivity of greater than 3.9.

Example 22 includes a method including forming a Gallium Nitride (GaN) substrate, the GaN substrate formed to have a non-etched surface, first and second vertical etched surfaces, the first vertical etched surface on a first side of the non-etched surface and the second vertical etched surface on a second side of the non-etched surface, and first and second horizontal etched surfaces, the first horizontal etched surface on the first side of the non-etched surface and the second horizontal etched surface on a second side of the non-etched surface. The method of example 22 includes depositing a dummy polysilicon on the non-etched surface of the GaN substrate. The method of example 22 includes depositing first and second p-type GaN regions with respect to the dummy polysilicon, wherein the first p-type GaN region is formed on a first side of the dummy polysilicon and the second p-type GaN region is formed on a second side of the dummy polysilicon, the first p-type GaN region sharing an interface with the first vertical etched surface of the GaN substrate and the first horizontal etched surface of the GaN substrate, and the second p-type GaN region sharing an interface with the second vertical etched surface of the GaN substrate and the second horizontal etched surface of the GaN substrate. The method of example 22 includes depositing first and second p-type Indium Nitride (InN) regions with respect to the first and second p-type GaN regions, the first p-type InN region on the first side of the dummy polysilicon and the second p-type InN region on the second side of the dummy polysilicon, the first p-type InN region sharing an interface with the first p-type GaN region, and the second p-type InN region sharing an interface with the second p-type GaN region. The method of example 22 includes depositing first and second n-type Indium Gallium Nitride (InGaN) regions with respect to the first and second p-type InN regions, the first n-type InGaN region on the first side of the dummy polysilicon and the second n-type InGaN region on the second side of the dummy polysilicon, the first n-type InGaN region sharing an interface with the first p-type InN region, and the second n-type InGaN region sharing an interface with the second p-type InN region. The method of example 22 includes removing the dummy polysilicon, depositing a high k dielectric material on the non-etched surface of the GaN substrate in place of the dummy polysilicon, and depositing a gate on the high k dielectric material. The method of example 22 includes depositing a source on the first n-type InGaN region and depositing a drain on the second n-type InGaN region.

Example 23 includes the subject matter of example 22, wherein the GaN substrate is doped p-type.

Example 24 includes the subject matter of example 22, wherein the first and second p-type GaN regions are doped to a concentration of holes between 1e16/centimeters$^3$ and 1e17/centimeters$^3$.

Example 25 includes the subject matter of example 24, wherein the first and second p-type GaN regions have a thickness in a lateral direction between 1-5 nanometers.

Example 26 includes the subject matter of example 22, wherein the first and second p-type InN regions are doped to a concentration of holes between 5e19/centimeters$^3$ and 1e21/centimeters$^3$.

Example 27 includes the subject matter of example 26, wherein the first and second p-type InN regions have a thickness in a lateral direction between 1-5 nanometers.

Example 28 includes the subject matter of example 22, wherein the first and second n-type InGaN regions are doped to a concentration of holes between 5e19/centimeters$^3$ and 1e21/centimeters$^3$.

Example 29 includes the subject matter of example 28, wherein the first and second n-type InGaN regions have a thickness in a lateral direction between 10-100 nanometers.

Example 30 includes the subject matter of any of examples 23, 26-29, wherein the first and second p-type GaN regions are doped to a concentration of holes between 1e16/centimeters$^3$ and 1e17/centimeters$^3$.

Example 31 includes the subject matter of example 30, wherein the first and second p-type GaN regions have a thickness in a lateral direction between 1-5 nanometers.

Example 32 includes the subject matter of any of examples 23-25, 28-29, wherein the first and second p-type InN regions are doped to a concentration of holes between 5e19/centimeters$^3$ and 1e21/centimeters$^3$.

Example 33 includes the subject matter of example 32, wherein the first and second p-type InN regions have a thickness in a lateral direction between 1-5 nanometers.

Example 34 includes the subject matter of any of examples 23-27, wherein the first and second n-type InGaN regions are doped to a concentration of holes between 5e19/centimeters$^3$ and 1e21/centimeters$^3$.

Example 35 includes the subject matter of example 34, wherein the first and second n-type InGaN regions have a thickness in a lateral direction between 10-100 nanometers.

Example 36 includes the subject matter of any of examples 22-35, wherein the high k dielectric material has a permittivity of greater than 3.9.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. Although the examples disclosed herein have been shown in examples related to semiconductors and/or microprocessors, the examples disclosed herein may be applied to any other appropriate interconnect (e.g., a layered interconnect) application(s) or etching processes in general.

What is claimed is:

1. An apparatus comprising:
    a substrate comprising Gallium Nitride (GaN);
    a first material over a first region of the substrate, the first material comprising p-type GaN;
    a second material adjacent to the first material and over a second region of the substrate, the second material comprising p-type Indium Nitride (InN); and
    a third material adjacent to the second material and over a third region of the substrate, the third material comprising n-type Indium Gallium Nitride (InGaN).

2. The apparatus of claim 1, wherein the substrate comprises a first horizontal surface, a vertical surface adjacent the first horizontal surface, and a second horizontal surface adjacent the vertical surface and vertically above the first horizontal surface, wherein the first, second, and third materials are over the first horizontal surface and the first material is adjacent the vertical surface of the substrate.

3. The apparatus of claim 2, wherein the first material has a first lateral thickness in the range of 1 to 5 nanometers, the second material has a second lateral thickness in the range of 1 to 5 nanometers, and the third material has a third lateral thickness of not less than 10 nanometers.

4. The apparatus of claim 2, further comprising:
a gate dielectric over the second horizontal surface;
a gate metal on the gate dielectric; and
a source or drain coupled to the third material.

5. The apparatus of claim 1, wherein the first material comprises p-type GaN having a dopant concentration between $1e16$/centimeters$^3$ and $1e17$/centimeters$^3$.

6. The apparatus of claim 1, wherein the second material comprises p-type InN having a dopant concentration of between $5e19$/centimeters$^3$ and $1e21$/centimeters$^3$.

7. The apparatus of claim 1, wherein the third material comprises n-type InGaN having a dopant concentration between $5e19$/centimeters$^3$ and $1e21$/centimeters$^3$.

8. The apparatus of claim 1, wherein a portion of the first material extends over the second and third regions and under the second and third materials.

9. The apparatus of claim 8, wherein the second material is absent over the first region and a second portion of the second material extends over the third region and under the third material.

10. The apparatus of claim 9, wherein the third material is absent over the first and second regions.

11. The apparatus of claim 1, wherein the substrate comprises p-type GaN.

12. An electronic device comprising:
a substrate comprising Gallium Nitride (GaN), the substrate having a first horizontal surface, first and second vertical surfaces to first and second sides of the first horizontal surface, respectively, and second and third horizontal surfaces adjacent to the first and second vertical surfaces, respectively;
a dielectric material on the first horizontal surface;
a gate on the dielectric material;
first and second materials interfaced with the first and second vertical surfaces, respectively, and the second and third horizontal surfaces, respectively, the first and second materials each comprising p-type GaN;
third and fourth materials interfaced with the first and second materials, respectively, the third and fourth materials each comprising p-type Indium Nitride (InN);
fifth and sixth materials interfaced with the third and fourth materials, respectively, the fifth and sixth materials each comprising n-type Indium Gallium Nitride (InGaN);
a source on the fifth material; and
a drain on the sixth material.

13. The electronic device of claim 12, wherein the substrate comprises p-type GaN.

14. The electronic device of claim 12, wherein the first and second materials each comprise p-type GaN having a dopant concentration between $1e16$/centimeters$^3$ and $1e17$/centimeters$^3$.

15. The electronic device of claim 14, wherein the first and second materials each have a thickness in a lateral direction of between 1-5 nanometers.

16. The electronic device of claim 12, wherein the third and fourth materials each comprise p-type InN regions having a dopant concentration of between $5e19$/centimeters$^3$ and $1e21$/centimeters$^3$.

17. The electronic device of claim 16, wherein the third and fourth materials each have a thickness in a lateral direction of between 1-5 nanometers.

18. The electronic device of claim 12, wherein the fifth and sixth materials each comprise the n-type InGaN having a dopant concentration of between $5e19$/centimeters$^3$ and $1e21$/centimeters$^3$.

19. The electronic device of claim 18, wherein the fifth and sixth materials each have a thickness in a lateral direction of between 10-100 nanometers.

20. The electronic device of claim 12, wherein the dielectric material has a permittivity greater than 3.9.

* * * * *